United States Patent [19]
Hamilton et al.

[11] Patent Number: 5,801,442
[45] Date of Patent: Sep. 1, 1998

[54] MICROCHANNEL COOLING OF HIGH POWER SEMICONDUCTOR DEVICES

[75] Inventors: Robin E. Hamilton, Millersville; Paul G. Kennedy, Grasonville; John Ostop, Severna Park; Martin L. Baker, Sykesville; Gregory A. Arlow, Eldersburg; John C. Golombeck, Gambrills, all of Md.; Thomas J Fagan, Jr., Pittsburgh, Pa.

[73] Assignee: Northrop Grumman Corporation, Los Angeles, Calif.

[21] Appl. No.: 681,207

[22] Filed: Jul. 22, 1996

[51] Int. Cl.⁶ .......................... H01L 23/34
[52] U.S. Cl. .......................... 257/714; 257/712
[58] Field of Search .......................... 257/714, 715, 257/717, 712, 705, 706

[56] References Cited

U.S. PATENT DOCUMENTS

| | | | |
|---|---|---|---|
| 4,450,472 | 5/1984 | Tuckerman et al. | 257/714 |
| 4,758,926 | 7/1988 | Herrell et al. | 257/714 |
| 4,894,709 | 1/1990 | Phillips et al. | 257/714 |
| 5,051,814 | 9/1991 | Paal | 257/714 |
| 5,218,515 | 6/1993 | Bernhardt | 257/714 |
| 5,293,070 | 3/1994 | Burgess et al. | |
| 5,453,641 | 9/1995 | Mundinger et al. | 257/714 |

Primary Examiner—Mahshid D. Saadat
Assistant Examiner—S. V. Clark
Attorney, Agent, or Firm—Walter G. Sutcliff

[57] ABSTRACT

Cooling of densely packaged semiconductor devices is achieved by microchannels which extract heat by forced convection and the use of fluid coolant located as close as possible to the heat source. The microchannels maximize heat sink surface area and provides improved heat transfer coefficients, thereby allowing a higher power density of semiconductor devices without increasing junction temperature or decreasing reliability. In its preferred embodiment, a plurality of microchannels are formed directly in the substrate portion of a silicon or silicon carbide chip or die mounted on a ground plane element of a circuit board and where a liquid coolant is fed to and from the microchannels through the ground plane. The microchannels comprise a plurality of closed-ended slots or grooves of generally rectangular cross section. Fabrication methods include deposition and etching, lift-off processing, micromachining and laser cutting techniques.

22 Claims, 9 Drawing Sheets

FIG.10
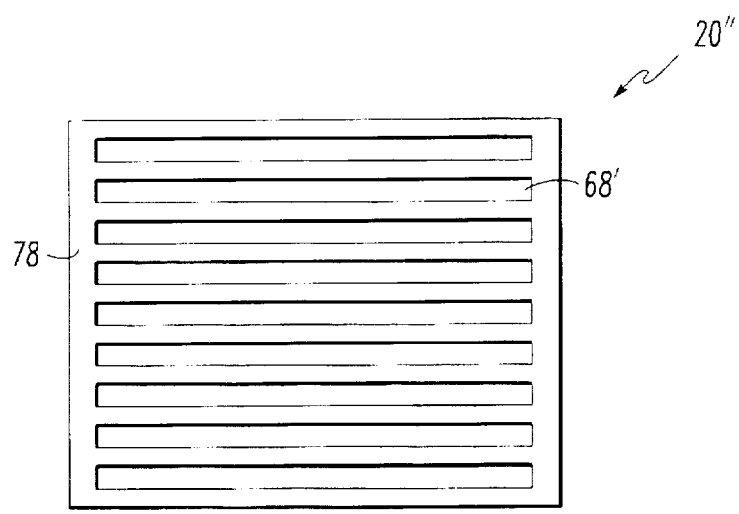
FIG.11
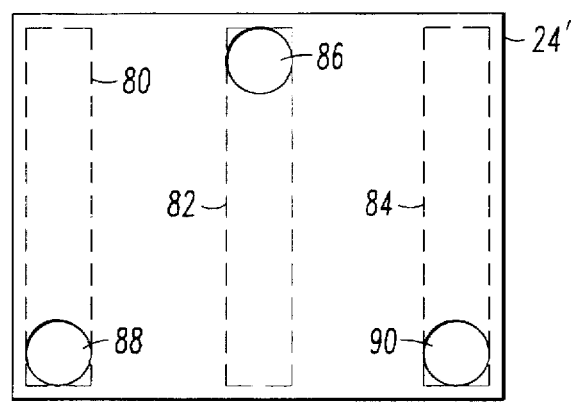
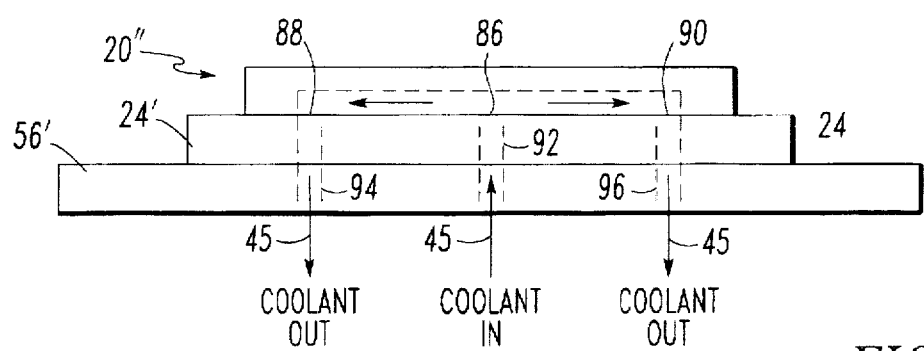
FIG.12

FIG. 13A
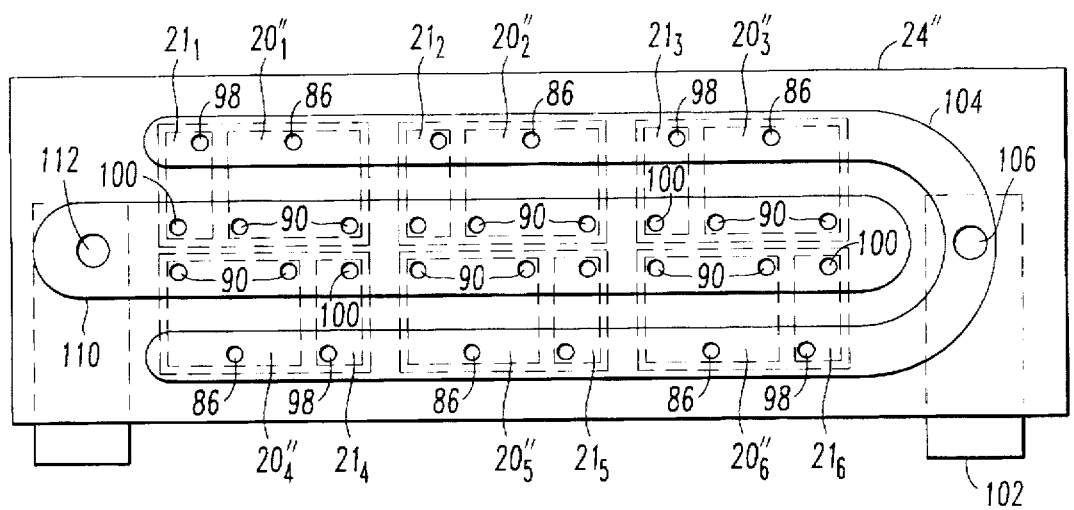
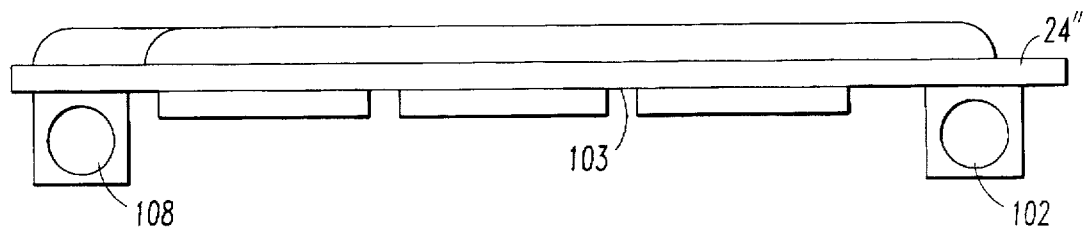
FIG. 13B

MICROCHANNEL COOLING OF HIGH POWER SEMICONDUCTOR DEVICES

BACKGROUND OF THE INVENTION

1. Field of the Invention

This invention relates to convection cooling of high power semiconductor devices and more particularly to microchannel cooling of semiconductor devices formed on a chip of semiconductor material including silicon and silicon carbide.

2. Description of the Prior Art

As the state of the art of semiconductor technology advances and more particularly to those types of devices which are known as power semiconductor devices, and the circuitry associated therewith, there is a continued demand that such devices operate faster and handle more power, while being ever smaller and lower in cost. The semiconductor industry has responded with the development of integrated circuit chips including thereon a large number of transistor devices such as bipolar transistors including power switching devices such as insulated gate bipolar transistors which are particularly applicable for use in medium to high power (1 to 100 kW or more) power converters. Moreover, these devices are currently being incorporated in densely packaged structures that can handle kilowatts of power.

The greatest limitation in the design of such low cost, light weight, high power devices is providing reliable cooling of the densely packaged components. Current state of the art electronic packaging techniques typically utilize redundant parts and excess substrate boundary regions as well as operating the electronics at less than their rated values. For example, in transmitters, silicon RF transistors are typically operated below their power output capability and spaced apart from one another by relatively large separation distances in order to keep them cooled to standardized operating temperatures. The maximum device junction temperature of a silicon bipolar transistor, as dictated by system reliability studies, is normally between 125° and 135° C. The same techniques apply to power switching devices.

More recently, the use of silicon as substrates is being replaced by the use of silicon carbide which can tolerate increased operating temperatures. These devices, however, are still limited internally by known power density and thermal considerations. In conventionally cooled power semiconductors, moreover, the heat generated in a silicon substrate is conducted through several layers of material to an air or liquid cooled heat sink.

SUMMARY

Accordingly, it is a primary object of the present invention to provide an improvement in the extraction of heat from electronic components.

It is another object of the invention to provide an improvement in the cooling of semiconductor devices.

It is a further object of the invention to provide an improvement in the cooling of power semiconductor devices which are utilized in densely packaged configurations.

It is yet another object of the invention to provide an improvement in densely packaged semiconductor by convection cooling.

Briefly, the foregoing objects are achieved by microchannel cooling of densely packaged semiconductor devices which extract heat by forced convection and the use of dense fluids in very small channels located as close as possible to the heat source. This maximizes heat sink surface area and provides improved heat transfer coefficients, thereby allowing a higher power density of semiconductor devices without increasing junction temperature or decreasing reliability. In its preferred embodiment, a plurality of microchannels are formed directly in the substrate portion or die of a silicon or silicon carbide chip mounted on a ground plane element of a circuit board and where a liquid coolant is fed to and from the microchannels through the ground plane. The microchannels comprise a plurality of closed-ended passages of generally rectangular cross section. Fabrication methods include deposition and etching, lift-off processing, micromachining and laser cutting techniques.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 10 is a bottom elevational view of a device such as shown in FIG. 9 and being further illustrative of microchannel arrangement formed therein;

FIG. 11 is a top elevational view of a ceramic frame for the device shown in FIG. 9 and being illustrative of input and output microchannel coolant manifolds with a single input port and two output ports;

FIG. 12 is a diagram illustrative of the coolant paths for the embodiment shown in FIG. 9;

FIG. 13A is a top elevational view of a third embodiment of the subject invention;

FIG. 13B is a front elevational view of the embodiment shown in FIG. 12A and being illustrative of the fluid input and output ports therefor;

DETAILED DESCRIPTION OF THE PREFERRED EMBODIMENTS

This invention is directed to the concept of the inclusion of a plurality of closed-ended convection cooling microchannels formed directly in the semiconductor chip, also referred to herein as a die, comprised of silicon or silicon carbide on which are formed a plurality of high power semiconductor devices such as bipolar transistors used for RF amplifier and insulated gate bipolar transistors and diodes used in connection with switching applications such as power converters.

Figure 1:
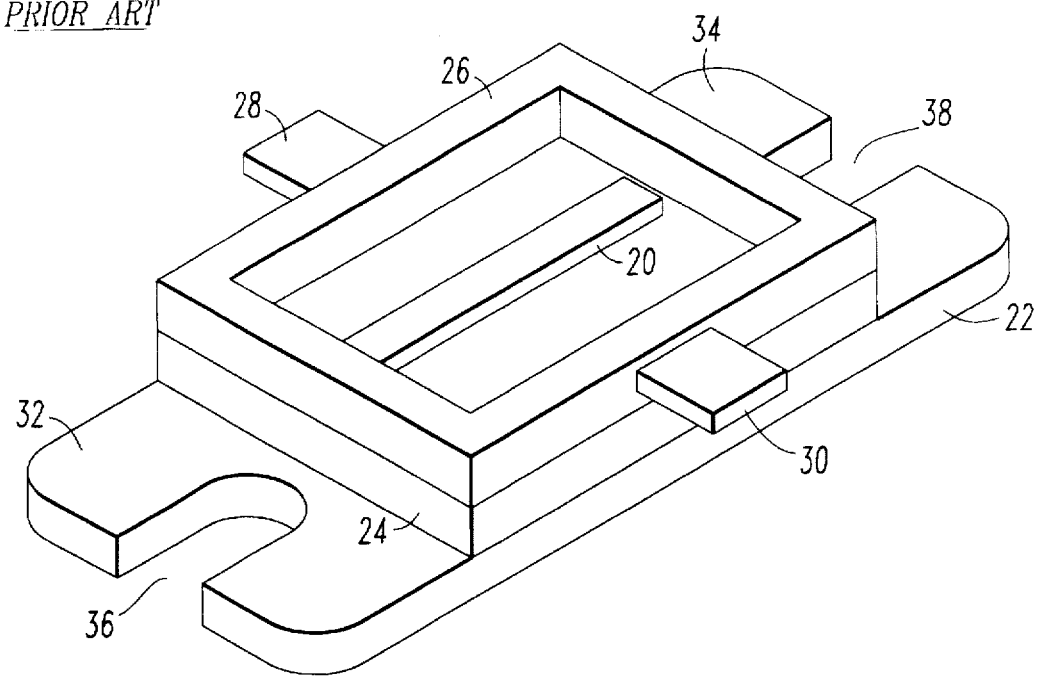
FIG. 1 is a perspective view of a silicon bipolar transistor package in accordance with the known prior art.
Figure 2A:
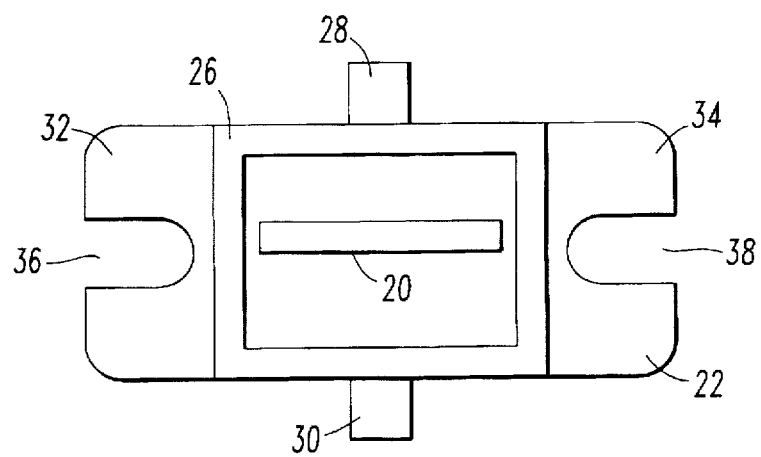
FIG. 2A is a top plan elevational view of the bipolar transistor package shown in FIG. 1.
Figure 2B:
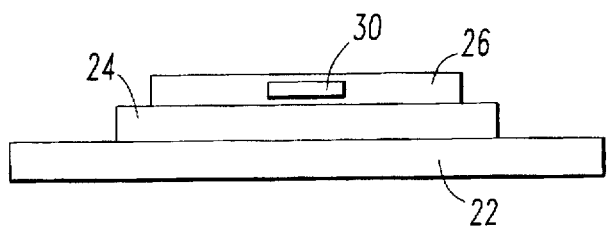
FIG. 2B is a front elevational view of the bipolar transistor package shown in FIG. 1.
Figure 3:
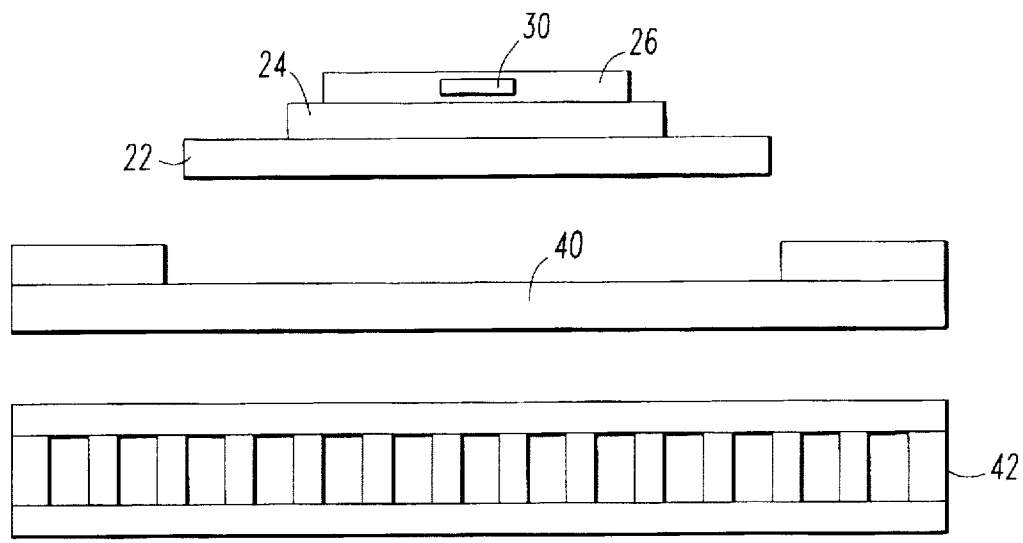
FIG. 3 is an exploded front elevational view of the bipolar transistor package shown in FIG. 1 and its associated ground plane and heat sink therefor in accordance with the known prior art.

Referring now to the drawings and more particularly to FIGS. 1 through 3, shown therein is a conventional high power transistor package including a plurality of RF transistors distributed across the top of a silicon or silicon carbide die identified by reference numeral 20 and typically having a dimension of 0.35 in.×0.035 in.×0.004 in.

The chip/die 20 is located in a package including a nickel plated copper-tungsten flange 22 on which is located a beryllium oxide (BeO) substrate 24 which is nickel (Ni) plated and screen printed with a suitable metal pattern such as molybdenum-manganese ($M_o/M_n$) alloy. The substrate 24 supports the chip/die 20. On top of the substrate 24 is located an aluminum oxide ($Al_2O_3$) window frame 26 and through which a pair of beam leads 28 and 30 project and which couple to leads, not shown, connected to the transistor devices, not shown, formed on the die 20. The flange 22 additionally includes outwardly extending end portions 32 and 34 for connection to external circuitry, not shown, via a pair of U-shaped slots 36 and 38. The flange 22, the substrate 24, the window frame 26 and the leads 28 and 30, are brazed together in one operation using a gold/copper (Ag/Cu) alloy braze which is then gold (Ag) plated to provide a finalized packages. After the die 20 is attached, the semiconductor devices are wire bonded using a gold wedge bonder. A covar lid, not shown, is normally attached to the ceramic window frame 26 to form a hermetically sealed package.

With such a structure, solid state transmitter designers need only to bolt the device to a ground plane element 40 (FIG. 3) which may comprise part of a circuit board or another substrate. The element 40 is then bolted to a separate air or liquid cooled heat exchanger shown by reference numeral 42.

Where the number of semiconductor devices on the silicon chip/die comprises, for example, 100 or more silicon bipolar transistors operating at RF frequencies, a large amount of concentrated waste heat is generated which must be dissipated by conduction through several lossy layers and interfaces both within the package and through the ground plane 40 and the heat exchanger 42. Although this packaging approach has been utilized in the past due to its simplicity and low cost, advancement in high power device designs has pushed the requirement for efficient thermal designs beyond conventional packing schemes including that shown in FIGS. 1–3.

Several design features dictate the thermal properties of these devices. These include the coolant properties and flow rate, the heat exchanger efficiency, the device's substrate interface and the internal device temperature rise. However, coolant type, flow rate and inlet temperatures are often dictated by operating platforms or customer specifications. In addition, a dramatic improvement in a finned type heat exchanger without further pushing flow rate and pressure drop, has not been perfected. The thermal interface between the transistor flange and the substrate ground plane may be improved with solder or conductive epoxy. Unfortunately, this adds considerable system cost in rework and retrofitting. However, up to now, great thermal or electrical efficiency improvements in the transistor package have eluded transistor designers.

Turning attention to the subject invention, thermal improvements can be realized by replacing silicon with silicon carbide. Silicon carbide material is more than a 3 to 1 better thermal conductor than silicon. In conjunction with circuit layout refinements, the thermal impedance within an RF transistor package is decreased by approximately 37%. In addition, silicon carbide permits increased power densities over silicon by offering superior voltage and current performance, thereby enabling higher density circuits that can operate over a wider temperature range. Silicon carbide transistors can operate reliably up to 200° C. junction temperature. This increases the allowable temperature Δ between the ambient and the transistor junction by 75° C. thus permitting considerably more heat to be dissipated utilizing conventional packaging and heat removal schemes. With silicon carbide, the maximum heat dissipation of an RF transistor can be increased as much as 2.5 times.

This now leads to a consideration of the preferred embodiments of the invention and which include microchannel heat sink geometries which are fabricated directly in the active device portions of the chip or die on which a plurality of identical semiconductor devices are fabricated so that a liquid convection coolant is brought as close as possible to the heat source, thus eliminating the inefficient thermal gradients through the device, circuit board and heat exchanger.

Figure 6:
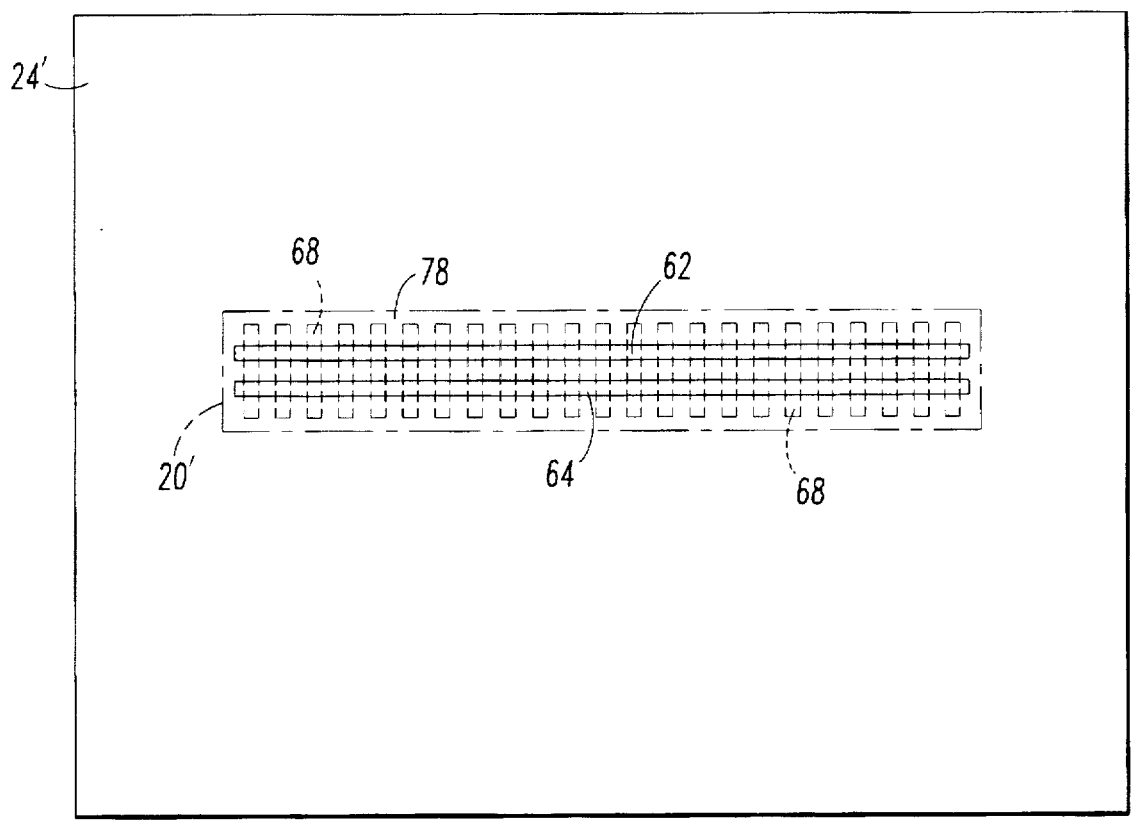
FIG. 6 is an enlarged top elevational view of the ceramic substrate included in the embodiment of the invention shown in FIGS. 4A and 4B.
Figure 4A:
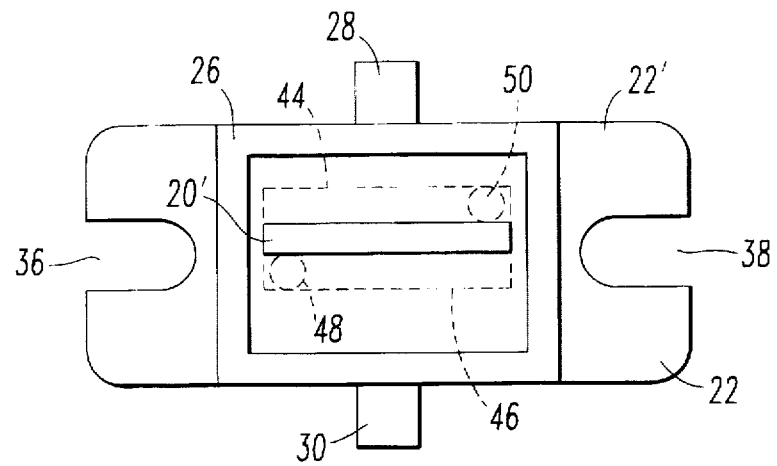
FIG. 4A is a top plan or elevational view of a silicon bipolar transistor package in accordance with a first embodiment of the subject invention.
Figure 4B:
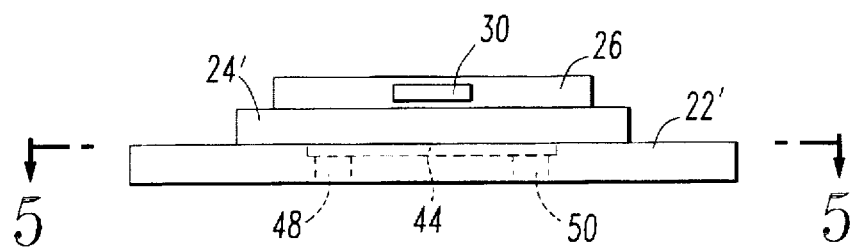
FIG. 4B is a front elevational view of the embodiment shown in FIG. 4A.
Figure 4C:
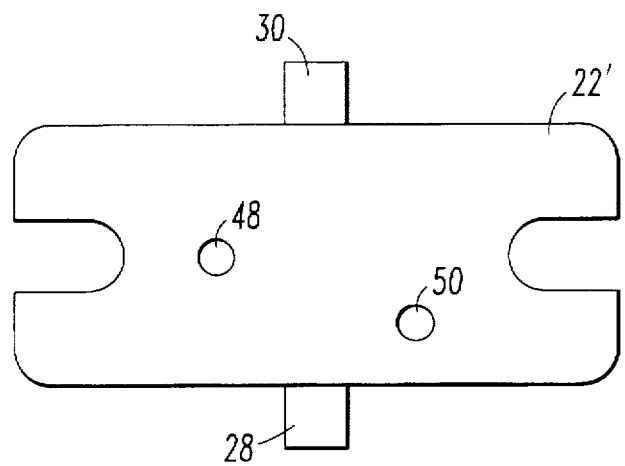
FIG. 4C is a bottom elevational view of the embodiment shown in FIG. 4A.
Figure 5A:
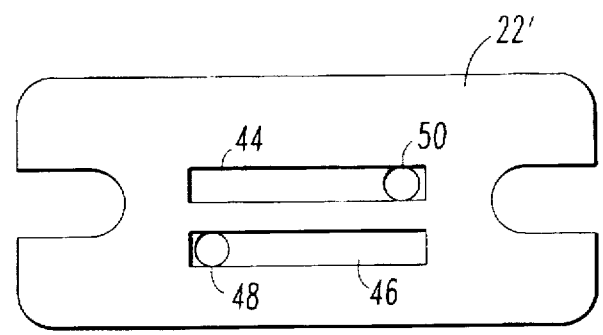
FIG. 5A is a sectional view of the embodiment shown in FIG. 4B taken along the lines 5—5 thereof.
Figure 5B:
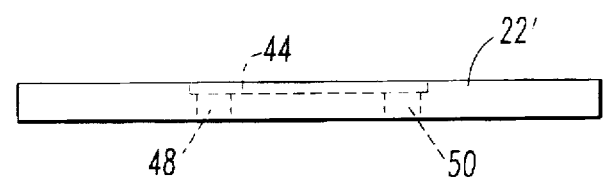
FIG. 5B is a front edge elevational view of the member shown in FIG. 5A.
Figure 7:
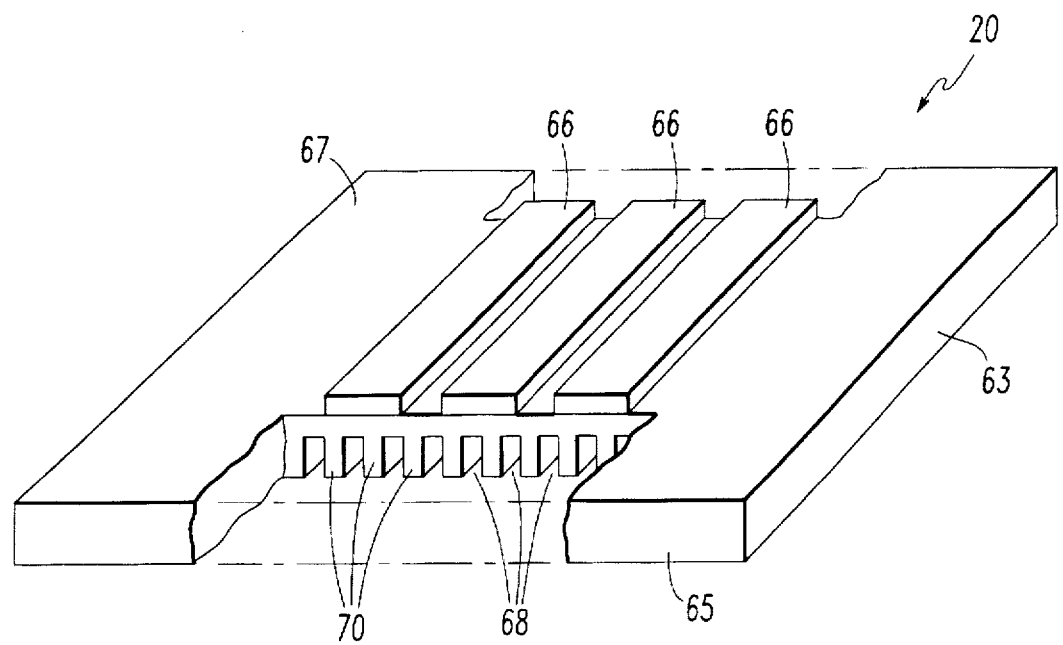
FIG. 7 is a partial cut-away perspective view of the semiconductor chip included in the embodiment shown in FIGS. 4A-4C and being illustrative of a plurality of convection cooling microchannels formed therein.
Figure 8:
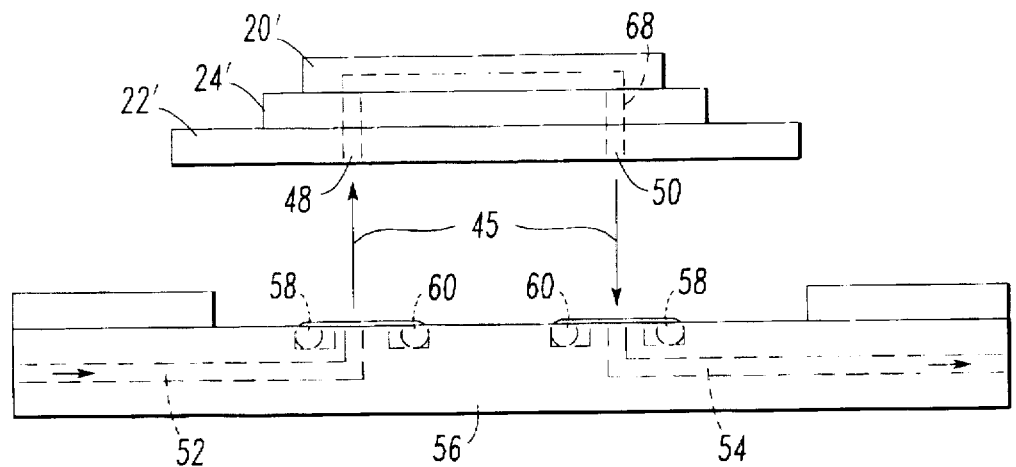
FIG. 8 is an exploded view of a front elevational view of the embodiment of the invention shown in FIGS. 4A-4C mounted on a ground plane including coolant ducts formed therein.

Referring now to FIGS. 4 through 8, which is directed to a first embodiment of the invention, FIGS. 4A–4C depict a microchannel cooled silicon bipolar transistor package including a flange 22', the details of which are further shown in FIGS. 5A–5B, including a pair of elongated rectangular recesses 44 and 46 which are spaced relatively close together in mutual parallel alignment. The recesses 46 and 48 comprise coolant manifolds for coolant coupled thereto via an inlet port 48 located at one end of manifold 46 and an output port 50 located at an opposite end of the manifold 44. As shown in FIG. 8, a liquid coolant 46 is coupled to and from the ports 48 and 50 by means of coolant ducts 52 and 54 formed in a ground plane member 56. A pair of O-rings 58 and 60 act as seals for the ducts 52 and 54 coupled to the input and output ports 48 and 50.

Contiguous with the top of the flange 22' is a substrate member 24' which is shown by the top elevational view at FIG. 6. As shown, the substrate 24' includes a pair of relatively narrow coolant manifold slots 62 and 64 which when the substrate 24' is in place, straddle the coolant manifolds 44 and 46 of the flange 22' lengthwise and thus are coupled thereto along their length such that, for example, slot 62 extends over the manifold 44, while the slot 64 extends over the manifold 46. A silicon bipolar transistor chip/die 20', the details of which are shown in FIG. 7, is positioned over the two manifold slots 62 and 64 so that the bottom surface 65 of the chip 20' is fluidly coupled to the manifolds 44 and 46.

As to the structure of the chip/die 20' shown in FIG. 7, it is depicted as comprising a relatively long, thin body 63 of semiconductor material of silicon or silicon carbide having a plurality of like or identical semiconductor devices 66 fabricated on the top portion 67 thereof and being arranged in a parallel configuration along the length of the semiconductor body as shown. Along the bottom surface 65 is located a plurality of evenly spaced parallel close-ended microchannels 68 which run transverse to the length of the semiconductor body 63 and in mutual parallel alignment with the semiconductor devices 66. Each microchannel 68 typically comprises a groove 0.004 in. deep by 0.001 in. wide. The length of the microchannels 68 are typically 0.032 in. long, with separation spacings 70 of 0.001 in. When desirable, the microchannel 68 can have a width up to 0.004 in., a depth anywhere from 0.006–0.0010 in. and with a spacing up to 0.003 in.

With such a structural arrangement, the heat generated in the bipolar transistors 66 is transferred through solid upper portion of the chip 20' and the fins 70 of the microchannels by conduction and is thereafter transferred to a liquid coolant 45 flowing through the microchannels 68 to and from the manifolds 44 and 46 through the slots 62 and 64. Suitable coolants 45 for the microchannels 68 include water, ethylene glycol water, poly-alpha-olefin, silicate ester, and "Fluorinert" brand liquids, e.g. FC-70, manufactured by the 3M Company.

The use of the very narrow channels or microchannels 68 directly in the chip 20' enhances heat transfer in two ways. First, narrow channels can be closely spaced, providing a large number of fins with a combined surface area much greater than the "foot print" of a conventional heat sink. In addition, the small hydraulic dimensions of the narrow passages provided by the microchannels 68 result in relatively high convection heat transfer coefficients. Since the thermal conductance of a heat sink is proportional to the product of the convective heat transfer coefficient and the surface area, the microchannels 68 permit an increase in the maximum power density for a given operating temperature. The small size of the microchannel heat sink is thus ideal for direct cooling of hot semiconductor components. The thermal efficiencies in large mass typical with traditional heat transferred from a device, through a heat spreader to a heat exchanger are eliminated. Also, the superior performance realized by microchannel heat sinks enables minimal flow of coolant to effectively remove heat from a hot device. When compared to traditional packaging techniques, as shown in the following Table I, the scheme shown in FIGS. 4–7 reduces the thermal impedance between the coolant and the transistor junction of the bipolar transistors 66 shown in FIG. 7, by over 30%, while reducing the coolant flow required by over 75%. These improvements break the thermal barriers limiting state of the art transistor circuit density designs and power output capability.

TABLE I

| | Silicon Transistor Conventional Liquid Cooling | Silicon Carbide Transistor Conventional Liquid Cooling | Silicon Carbide Transistor Microchannel Cooling |
|---|---|---|---|
| Device heat dissipation | 31 Watts | 77 Watts | 240 Watts |
| Device junction temp | 125° C. | 200° C. | 165° C. |
| Thermal Impedance: | | | |
| junction-case | 1.28° C./W | 0.81° C./W | — |
| case-substrate interface | 0.44° C./W | 0.44° C./W | — |
| substrate fluid | 0.61° C./W | 0.61° C./W | 0.21° C./W* |
| fluid | 0.08° C./W | 0.08° C./W | 0.27° C./W |
| total: | 2.41° C./W | 1.94° C./W | 0.48° C./W |
| Coolant type | 60/40EGW | 60/40EGW | 60/40EGW |
| Inlet fluid temp. | 50° C. | 50° C. | 50° C. |
| Fluid flow rate | 2 gpm | 2 gpm | 0.017 gpm (63 cc/min) |

*device junction-fluid

Figure 9:
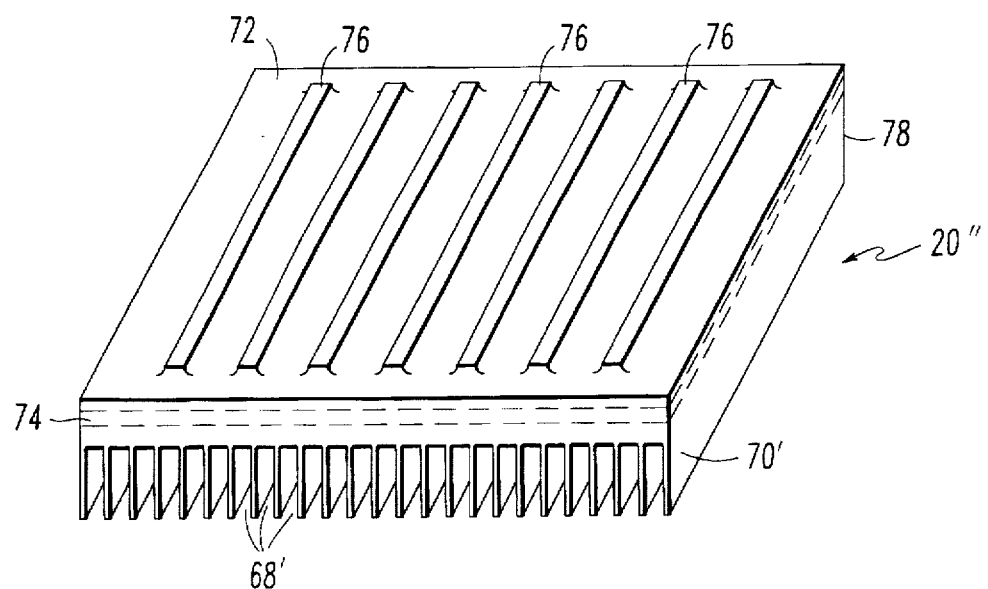
FIG. 9 is a perspective view illustrative of a second embodiment of the invention.

Referring now to a second embodiment of the invention, reference will now be made to FIGS. 9–11. Shown thereat is an implementation for microchannel cooling of a die of power switching semiconductor devices such as insulated gate bipolar transistors. The semiconductor structure shown in FIG. 9 is shown comprising a silicon chip/die 20" on which is formed a plurality of insulated gate bipolar transistors (IGBT) having a common upper emitter region 72 and underlying common collector region 74 and respective interdigitated gate electrodes 76. Beneath the collector region 74 is a region 78 containing a plurality of microchannels 68', as further shown in FIG. 10, which is intended to depict the fact that the microchannels 68' are close-ended in the same fashion as the microchannels 68 shown in FIG. 7 and that they are also aligned in mutually parallel relationship and of substantially the same size. In the IGBT microchannel structure of FIG. 9, however, the depth of the channel 68' is 0.008 in., while being 0.002 in. wide, with a 0.001 spacing which define a set of relatively thin fins 70' in comparison to their 0.008 in. depth dimension. The die 20" (FIG. 10) sits on a ceramic frame 24' which now includes three generally rectangular coolant manifolds 80, 82 and 84 which are spaced apart as shown in FIG. 11. The middle manifold 82 comprises a coolant input manifold having a coolant inlet port 86 formed at one end, while the two outer manifolds 80 and 84 comprise output manifolds and including a respective coolant outlet ports 88 and 90 at the opposite end from the inlet port 86. The die 20', moreover, is oriented with respect to the ceramic substrate 24' such that the microchannels 68' are orthogonal to the manifolds 80, 82 and 84. The liquid coolant flow direction is further shown in FIG. 12, where both the chip 20' and the ceramic substrate 24' are mounted on a ground plane 56' having a single coolant input duct 92 and two output ducts 94 and 96. Such a configuration operate to keep conduction lengths as short as possible.

Referring now to FIGS. 13A and 13B, shown thereat is a cooling architecture for a third embodiment of the invention which includes the incorporation of fast, soft recovery back diodes connected across a set of IGBT devices in a three phase IGBT power bridge module which can be used, for example, in electric motor control. As shown in FIG. 13A, six IGBT dies $20_1"$ . . . $26_6"$ each having single inlet ports 86 and dual outlet ports are positioned next to six back diode dies $21_1$ . . . $21_6$, each including a single inlet port 98 and a single outlet port 100. A single coolant inlet duct 102 is connected at one end to the underside 103 of the ceramic substrate 24". The substrate is also configured to include a U-shaped inlet coolant manifold 104 having an inlet port 106 formed in the curved end portion thereof. A single coolant outlet duct 108 is connected to the underside 103 at the other end of the ceramic substrate 24" where it connects to a single elongated coolant manifold 110 which runs down the center of the substrate 24" between the arms of the inlet manifold 104. An output port 112 connects the coolant outlet manifold 110 to the output duct 108.

The embodiments of the invention thus disclosed having improved heat transfer coefficients permit increased power density with fewer devices, fewer circuits and fewer assemblies when compared to conventionally cooled units delivering the same level of power.

Figure 14:
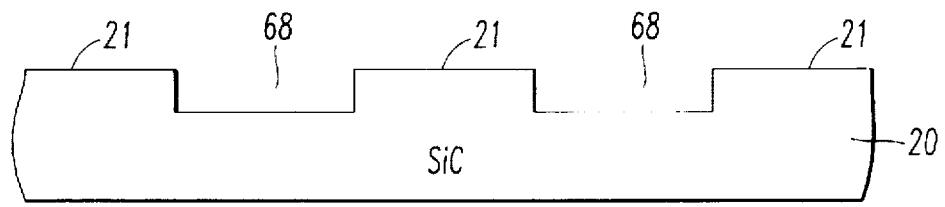
FIG. 14 is a diagram illustrative of a first method for forming microchannels in a silicon carbide device.

Referring now to FIGS. 14 through 16, shown thereat are three fabrication techniques for forming microchannels 68 in semiconductor substrates and more particularly silicon carbide. As shown in FIG. 14, the simplest way for forming microchannels 68 is simply to use a micromachining process such as saw cutting, into the back of a silicon carbide substrate 20. This technique eliminates any thermal expansion mismatch issues between the silicon carbide and any deposited channel material. The channels can also be formed by using well known laser cutting techniques.

Figure 15A:
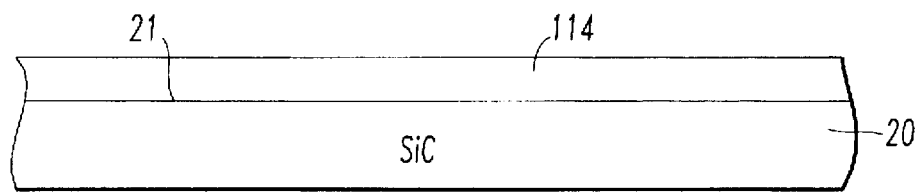
FIGS. 15A–15C are diagrams illustrative of a second method for forming microchannels on silicon carbide.
Figure 15B:
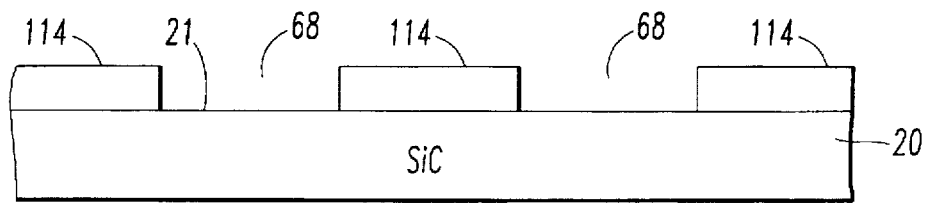
Figure 15C:
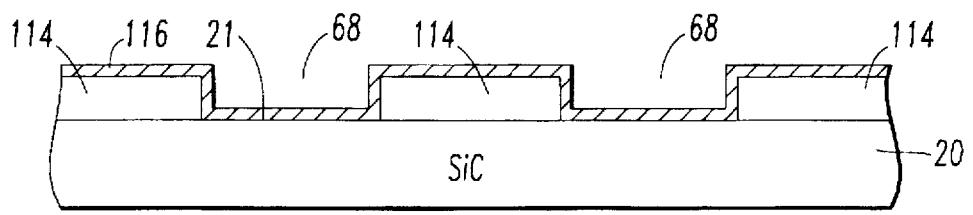

Another approach to the formation of microchannels 68 on a silicon carbide substrate 20 is to utilize a deposition and etching process shown in FIGS. 15A–15C. As shown in FIG. 15A, a layer of semiconductor or metal alloy material 114, with adequate thermal conductivity and suitable thermal expansion, is built up on one side 21 of a wafer 20 using either deposition or plating. Silicon comprises a suitable semiconductor material. A metal candidate is tungsten. Next as shown in FIG. 15B using photolithographic techniques, the material 114 is then etched to form the microchannels 68. Following this and as shown in FIG. 15C, a layer of high conductivity material 116 is then deposited on all surfaces of the microchannel 68 as well as the residual material 114 to produce a heat sink with microchannels 68 formed therein. The material outer layer of material 116 serves two purposes. It provides an increased electrical drain contact area for the present silicon carbide transistor design, and it also improves the wetting of the coolant to the channel walls for improved thermal performance.

Figure 16A:
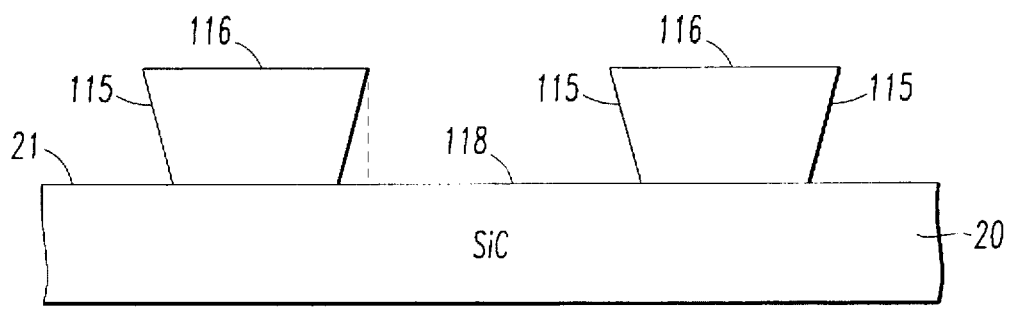
FIGS. 16A–16C are diagrams illustrative of a third method for forming microchannels on silicon carbide.
Figure 16B:
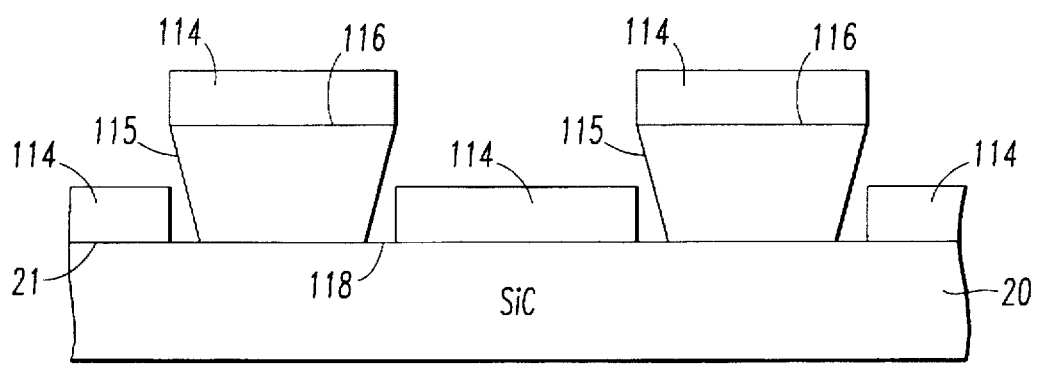
Figure 16C:
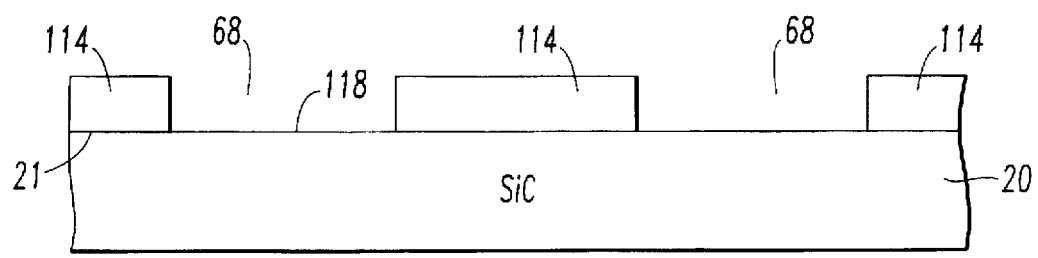

The third fabrication technique comprises a lift-off process shown in FIGS. 16A–16C. As depicted in FIG. 16A, a selected type of lift-off material 116, which may be, for example, photoresist, glass or silicon dioxide, is deposited on the top surface 21 of the silicon carbide substrate 20. The material is then etched so that the remaining geometry has a retrograde profile as shown in FIG. 16A, meaning that the bottom of the etch at the surface 118 is wider than at the top. Microchannel material 114 is then deposited over the resultant mesa configuration 115 as shown in FIG. 16B. This causes the deposition of items to fall nearly perpendicular to the surface 118 of the silicon carbide. Microchannels 68 are then formed as shown in FIG. 16C by etching away the lift-off material 116 and the microchannel material 114 deposited thereon.

Thus what has been shown and described is an innovative packaging technique and fabrication process for implementing microchannel cooling which will provide thermal efficiency improvements required for compact, high power transistor and/or integrated circuit designs, particularly circuits formed on silicon and silicon carbide.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A microchannel cooled semiconductor structure, comprising:
    a die of semiconductor material and wherein said semiconductor material is silicon or silicon carbide;
    a plurality of semiconductor devices formed in one region of said die; and
    a plurality of close-ended forced convection cooling microchannel slots formed in another region of said; and
    wherein said microchannel slots have a width ranging between about 0.001 in. and about 0.004 in., a depth ranging between about 0.004 in. and about 0.01 in., and a spacing therebetween ranging between about 0.001 in. and about 0.005 in.

2. A structure according to claim 1 wherein said plurality of semiconductor devices are formed on an upper region of said die of semiconductor material and said plurality of microchannel slots are formed beneath said semiconductor devices in a lower region of said die of semiconductor material.

3. A structure according to claim 1 wherein said microchannel slots have a channel length ranging between about 0.032 in. and about 0.5 in.

4. A structure according to claim 1 wherein said microchannel slots are arranged in mutual parallel relationship.

5. A structure according to claim 4 wherein said plurality of semiconductor devices are also arranged in mutually parallel relationship.

6. A structure according to claim 1 wherein said microchannel slots are aligned in parallel with said plurality of semiconductor devices.

7. A structure according to claim 1 wherein said die of semiconductor material is located on support means including means for coupling a fluid coolant to and from said microchannel slots.

8. A structure according to claim 7 wherein said fluid coolant comprises a liquid coolant.

9. A structure according to claim 8 wherein said support means includes a generally flat mounting flange including a plurality of coolant manifolds located adjacent and transverse to said microchannel slots for supplying said coolant to and receiving said coolant from said microchannel slots.

10. A structure according to claim 9 wherein said plurality of coolant manifolds comprises a pair of elongated mutually parallel recesses formed in said mounting flange.

11. A structure according to claim 10 and additionally including a substrate member located between said die and said mounting flange.

12. A structure according to claim 11 wherein said substrate member includes a pair of elongated coolant slots located over and in alignment with said pair of coolant manifolds in said mounting flange.

13. A structure according to claim 12 wherein said die, said substrate member and said mounting flange are included in a sealed package.

14. A structure according to claim 8 wherein said support means includes a frame member located on a ground plane including a plurality of coolants ducts formed therein, said frame member including a plurality of coolant manifolds coupling said coolant ducts to said microchannel slots.

15. A structure according to claim 14 wherein said plurality of coolant manifolds comprise three coolant manifolds oriented transverse to said microchannel slots for supplying said coolant to and receiving said coolant from said microchannel slots.

16. A structure according to claim 8 wherein said support means includes a substrate member having a U-shaped coolant manifold and an elongated straight coolant manifold located within said U-shaped coolant manifold for supplying coolant to and receiving coolant from said microchannel slots.

17. A structure according to claim 8 wherein said semiconductor devices are comprised of a plurality of transistors.

18. A structure according to claim 17 wherein said plurality of transistors comprise a plurality of RF transistors.

19. A structure according to claim 18 wherein said RF transistors comprise bipolar transistors.

20. A structure according to claim 17 wherein said plurality of transistors comprise a plurality of power switching transistors.

21. A structure according to claim 20 wherein said power switching transistors comprise insulated gate bipolar transistors.

22. A multichannel cooled semiconductor, comprising:

a die of silicon or silicon carbide;

a plurality of heat generating semiconductor devices formed in said die; and a plurality of close-ended cooling microchannel slots formed directly in said die in relatively close proximity to said plurality of semiconductor devices to provide convection cooling of said semiconductor devices, and wherein said microchannel slots have a width ranging between about 0.001 in. and about 0.004 in., a depth ranging between about 0.004 in. and about 0.01 in., a spacing therebetween ranging between about 0.001 in. and about 0.005 in., and a channel length ranging between about 0.032 in. and about 0.5 in.

* * * * *